United States Patent
Ngo et al.

(10) Patent No.: US 6,432,822 B1
(45) Date of Patent: Aug. 13, 2002

(54) METHOD OF IMPROVING ELECTROMIGRATION RESISTANCE OF CAPPED CU

(75) Inventors: Minh Van Ngo, Fremont; Steven C. Avanzino, Cupertino; Amit P. Marathe, Milpitas, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,611

(22) Filed: May 2, 2001

(51) Int. Cl.[7] ................................................ H01L 21/44
(52) U.S. Cl. .................. 438/687; 438/627; 438/628; 438/629; 438/643; 438/644; 438/653; 438/654; 438/678
(58) Field of Search ................ 438/687, 627, 438/628, 629, 643, 644, 653, 654, 678

(56) References Cited

U.S. PATENT DOCUMENTS

| | | | | |
|---|---|---|---|---|
| 4,731,156 A | * | 3/1988 | Montmarquet | 156/643 |
| 4,789,648 A | * | 12/1988 | Chow et al. | 437/225 |
| 5,343,064 A | * | 8/1994 | Spangler et al. | 257/350 |
| 5,413,687 A | * | 5/1995 | Barton et al. | 204/192.14 |
| 5,447,887 A | * | 9/1995 | Filipiak et al. | 437/200 |
| 5,621,241 A | * | 4/1997 | Jain | 257/632 |
| 5,693,563 A | * | 12/1997 | Teong | 437/190 |
| 5,728,629 A | * | 3/1998 | Mizuno et al. | 438/687 |
| 5,801,098 A | * | 9/1998 | Fiordalice et al. | 438/653 |
| 5,893,752 A | * | 4/1999 | Zhang et al. | 438/687 |
| 6,147,000 A | * | 11/2000 | You et al. | 438/687 |
| 6,153,523 A | * | 11/2000 | Van Ngo et al. | 438/687 |
| 6,165,894 A | * | 12/2000 | Pramanick et al. | 438/687 |
| 6,174,810 B1 | * | 1/2001 | Islam et al. | 438/687 |
| 6,261,963 B1 | * | 7/2001 | Zhao et al. | 438/687 |
| 6,309,959 B1 | * | 10/2001 | Wang et al. | 438/629 |
| 6,335,283 B1 | * | 1/2002 | Ngo et al. | 438/687 |
| 6,339,025 B1 | * | 1/2002 | Liu et al. | 438/687 |
| 6,348,410 B1 | * | 2/2002 | Ngo et al. | 438/687 |

OTHER PUBLICATIONS

S. Hymes et al., Passivation of copper by silicide formation in dilute silane:, J. Appl. Phys., vol. 71, No. 9, May 1, 1992, pp. 4623–4625.*

* cited by examiner

*Primary Examiner*—John F. Niebling
*Assistant Examiner*—Lynne A. Gurley

(57) ABSTRACT

The electromigration resistance of capped Cu or Cu alloy interconnects is significantly improved by treating the exposed planarized surface of the Cu or Cu alloy with a plasma containing $NH_3$ and $N_2$ under mild steady state conditions, thereby avoiding sensitizing the Cu or Cu alloy surface before capping layer deposition with an attendant improvement in electromigration resistance and wafer-to-wafer uniformity. Embodiments include treating the Cu or Cu alloy surface with a plasma at a relatively high $N_2$ flow rate of about 8,000 to about 9,200 sccm and a relatively low $NH_3$ flow rate of about 210 to about 310 sccm.

11 Claims, 2 Drawing Sheets

METHOD OF IMPROVING ELECTROMIGRATION RESISTANCE OF CAPPED CU

TECHNICAL FIELD

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to manufacturing high speed integrated circuits having submicron design features, and high conductivity interconnect structures with improved electromigration resistance.

BACKGROUND ART

The escalating requirements for high density and performance associated with ultra large scale integration semiconductor wiring require responsive changes in interconnection technology. Such escalating requirements have been found difficult to satisfy in terms of providing a low R×C (resistance×capacitance) interconnect pattern with electromigration resistance, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

In copending application Ser. No. 09/497,850 filed on Feb. 4, 2000 a method is disclosed comprising treating the surface of a Cu or Cu alloy layer with a plasma containing nitrogen and ammonia, followed by depositing the capping layer in the presence of nitrogen in the same reaction chamber for improved adhesion of the capping layer to the copper interconnect. These technique has been effective in improving adhesion of the capping layer. However, after further experimentation and investigation, it was found that capped Cu or Cu alloy interconnects, as in damascene and dual damascene structures, exhibited poor electromigration resistance, particular in those cases wherein the exposed surface of the Cu or Cu alloy was treated with a plasma to remove a copper oxide surface film prior to deposition of the capping layer, e.g., silicon nitride. Such poor electromigration resistance adversely impacts device reliability and results in poor product yield.

As design rules extend deeper into the submicron range, such as about 0.12 micron and under, the reliability of interconnect patterns becomes particularly critical and electromigration becomes increasingly problematic. Accordingly, there exists a need for methodology enabling the formation of encapsulated Cu and Cu alloy interconnects for vertical metallization levels with greater accuracy, reliability and electromigration resistance. There exists a particular need for methodology enabling the formation of capped Cu or Cu alloy interconnects, particularly in damascene structures, e.g., dual damascene structures comprising a dielectric material having a low dielectric constant (k), with improved electromigration resistance.

DISCLOSURE OF THE INVENTION

An advantage of the present invention is a method of manufacturing a semiconductor device having highly reliable capped Cu or Cu alloy interconnects.

Another advantage of the present invention is a method of manufacturing a semiconductor device comprising a silicon nitride capped Cu or Cu alloy interconnect with improved electromigration resistance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: treating a surface of a copper (Cu) or a Cu alloy layer with a plasma containing nitrogen ($N_2$) and ammonia ($NH_3$) in a chamber to reduce a copper oxide on the surface at: an $NH_3$ flow rate of about 210 to about 310 sccm; a $N_2$ flow rate of about 8,000 to about 9,200 sccm; and forming a capping layer on the treated surface of the Cu or Cu alloy layer.

Another aspect of the present invention is a method of manufacturing a semiconductor device, the method comprising: introducing a wafer containing inlaid copper (Cu) or a Cu alloy into a chamber; treating an exposed surface of the Cu or Cu alloy with a plasma containing ammonia ($NH_3$) and nitrogen ($N_2$) at: an $NH_3$ flow rate of about 210 to about 310 sccm; a $N_2$ flow rate of about 8,000 to about 9,200 sccm; an RF power of about 50 to about 200 watts; a temperature of about 300° C. to about 400° C.; and a pressure of about 3 to about 5 Torr; introducing silane ($SiH_4$) into the chamber after treating the surface of the Cu or Cu alloy with the plasma; and depositing a silicon nitride capping layer on the plasma treated Cu or Cu alloy surface.

Embodiments of the present invention include forming a Cu or Cu alloy dual damascene structure comprising a Cu or Cu alloy line connected to a lower Cu or Cu alloy via formed in dielectric material having a dielectric constant (k) less than about 3.9, placing a wafer containing the dual damascene structure into a chamber, introducing $N_2$ and $NH_3$ into the chamber and increasing the pressure. A plasma is then initiated and the upper surface of the Cu or Cu alloy is treated with the relatively soft plasma to remove any copper oxide formed thereon prior to introducing $SiH_4$ and depositing a silicon nitride capping layer thereon.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention.

Accordingly, the drawings and description are to be regarded as illustrative in nature, and not as restrictive.

DESCRIPTION OF THE INVENTION

Figure 1:
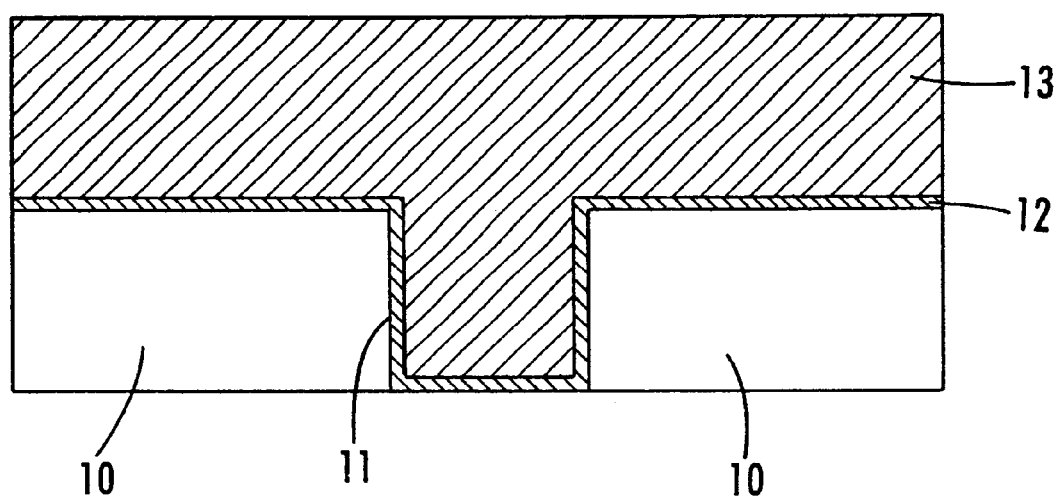
FIGS. 1–4 schematically illustrate sequential phases of a method in accordance with an embodiment of the present invention.

The present invention addresses and solves problems attendant upon forming capped Cu o r Cu alloy interconnects, as with a capping layer of silicon nitride, stemming from poor capping layer adhesion and electromigration. Methodology in accordance with embodiments of the present invention enables not only a significant improvement in the adhesion of a capping layer such as silicon nitride, to a Cu or Cu alloy interconnect, thereby preventing capping layer peeling and preventing copper diffusion, but also enables a significant improvement in electromigration resistance. As employed throughout this application, the symbol Cu is in tended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0. 12 micron and under, the electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion. The plasma treatment technique using a $NH_3$ and $N_2$ disclosed in copending application Ser. No. 09/497,850 improves adhesion of a silicon nitride capping layer to the Cu or Cu alloy layer. The present invention constitutes an improvement over such a plasma technique by further significantly improving the electromigration performance of the resulting capped interconnect.

Upon conducting experimentation and investigation, it was found that the surface of the Cu metallization, after plasma treatment to reduce the copper oxide, exhibited discoloration, e.g., black and/or green discoloration. It is believed that such discoloration is indicative of corrosion and/or poisoning which degrades the interface between the Cu and capping layer, as by reducing the adhesion therebetween. Further experimentation and investigation led to the belief that such degradation or poisoning of the interface between the Cu and capping layer stemmed from various factors.

Continuing experimentation and investigation supported the conclusion that treatment of the Cu surface, as with a plasma containing $NH_3$ and $N_2$, removed the oxide film and left an extremely clean, susceptible and highly reactive surface. Such a sensitized Cu surface exhibits a very high propensity to react with a reactant species, as with $SiH_4$, thereby forming reaction products, such as silicides. Such surface contamination, including corrosion and reactants, enhanced the surface pathway for surface diffusion and, hence, electromigration. It was further found that plasma treatment of the exposed Cu surface and created a rough surface which not only adversely impacted electromigration resistance but also within wafer and wafer-to-wafer uniformity. The adverse impact upon electromigration, within wafer uniformity and wafer-to-wafer uniformity becomes particularly acute as the design rule plunge deeper into the sub-micron regime.

The present invention addresses and solves the problem of surface contamination and surface reaction of inlaid Cu metallization after plasma treatment, as with an ammonia-containing plasma, thereby significantly improving the integrity of the interface between the Cu interconnect and capping layer, e.g., silicon nitride capping layer. Moreover, the present invention significantly improves electromigration resistance, and significantly improves within wafer and wafer-to-wafer uniformity. Accordingly, the present invention enables a significant increase in device reliability, particularly in the submicron regime.

In accordance with embodiments of the present invention, the plasma treating technique employing $NH_3$ and $N_2$ disclosed in copending application Ser. No. 09/497,850 is modified by softening the plasma, as by lowering the $NH_3$ flow rate and diluting the plasma with $N_2$. It was found that the use of a relatively soft plasma resulted in a steady state treatment and enabled the formation of a stabilized uniform capping layer thereon. It was also found that the use of a soft plasma significantly reduced hillock formation and resulted in a relatively smooth surface.

Embodiments of the present invention comprise treating a surface of the inlaid Cu, subsequent to CMP, in a chamber with a plasma containing a reduced amount of $NH_3$ and an increased amount of $N_2$, as at an $NH_3$ flow rate of about 210 to about 310 sccm, e.g., about 260 sccm, a $N_2$ flow rate of about 8,000 to about 9,200 sccm, e.g., about 8,600 sccm, a temperature of about 300° C. to about 400° C., a pressure of about 3 to about 5 Torr, and an RF power of about 50 to about 200 watts, typically for about 5 to about 25 seconds.

Embodiments of the present invention further include forming a Cu dual damascene structure in dielectric material having a dielectric constant (k) less than about 3.9, introducing $NH_3$ and $N_2$ into the chamber, increasing the pressure, and then, after about 10 to about 15 seconds, initiating a plasma to remove copper oxide formed on the exposed surface of the inlaid Cu believed to result from CMP.

After treatment of the exposed Cu surface, $SiH_4$ is then introduced into the chamber and a silicon nitride capping layer deposited on the plasma treated surface of the inlaid Cu. Deposition of the silicon nitride capping layer can be conducted at a $SiH_4$ flow rate of about 130 to about 170 sccm, e.g., 150 sccm, an RF power of about 400 to about 600 watts, a pressure of about 3.5 to about 6 Torr and a temperature of about 300° C. to about 400° C. The silicon nitride capping layer is typically deposited at a thickness of about 450 Å to about 550 Å.

The mechanism underpinning the significant reduction in electromigration failures, and improvement in within wafer and wafer-to-wafer uniformity attendant upon implementing the inventive methodology disclosed herein is not known with certainty. However, it is believed that treatment with a relatively soft plasma diluted with a high nitrogen flow avoids sensitization of the Cu surface after reduction of the copper oxide, improves electromigration performance and improves the uniformity of the reduced Cu surface, resulting in a uniformly deposited capping layer.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seed-layers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed in accordance with an embodiment of the present invention using a soft NH3 plasma diluted with $N_2$ prior to depositing a silicon nitride capping layer thereon.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass ™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

An embodiment of the present invention is schematically illustrated in FIGS. 1–4, wherein similar reference numerals denote similar elements or features. Adverting to FIG. 1, damascene opening 11, e.g., a trench, is formed in dielectric layer 10, e.g., a low-k material. It should be understood that opening 11 can also be formed as a dual damascene opening comprising a lower contact or via hole section in communication with an upper trench section. A barrier layer 12 is deposited, such as Ta and/or TaN, and Cu layer 13 is then deposited. Upon electroplating or electroless plating layer 13, a seed layer (not shown) is deposited on barrier layer 12.

Figure 2:
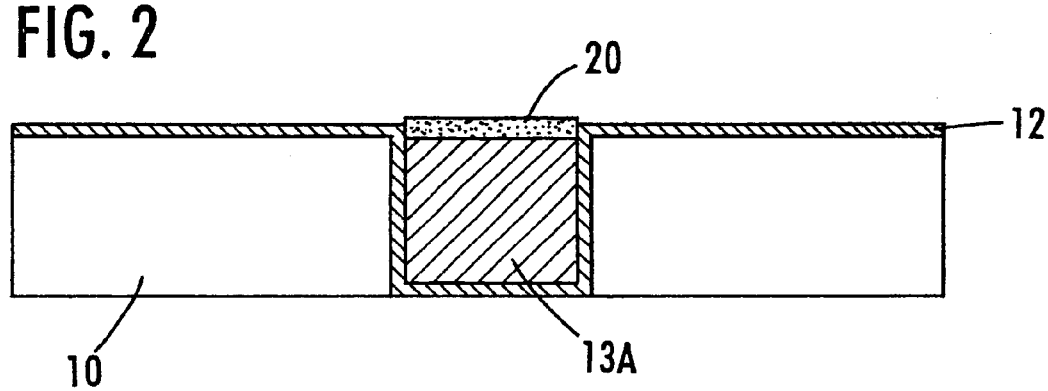

Adverting to FIG. 2, the portions of the Cu alloy layer 13 extending beyond opening 11 are removed, as by CMP. As a result, a thin film of copper oxide 20 is formed on the exposed surface of the Cu interconnect member 13A. The wafer containing the Cu metallization is then introduced into a chamber and processed in accordance with embodiments of the present invention.

Figure 3:
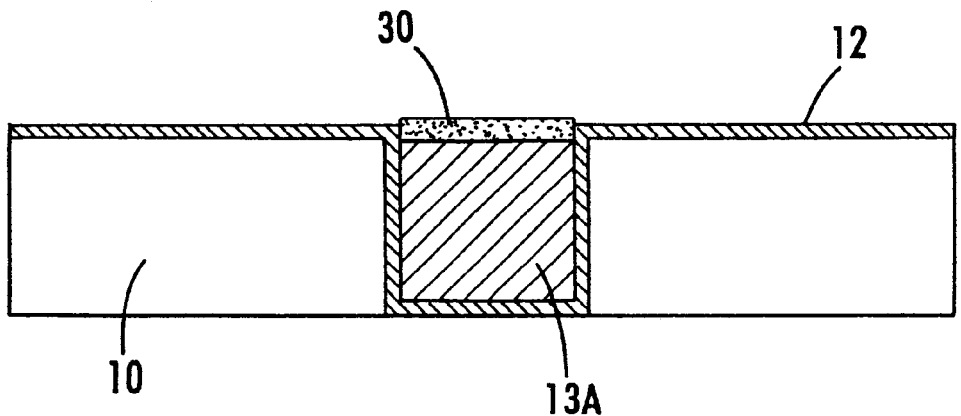

Adverting to FIG. 3, in accordance with embodiments of the present invention, the exposed surface of the Cu interconnect member 13A having a thin copper oxide film 20 thereon is treated with a soft NH$_3$-containing plasma diluted with N$_2$ to remove or substantially reduce the thin copper oxide film 20 leaving a relative uniform unsensitized surface.

Figure 4:
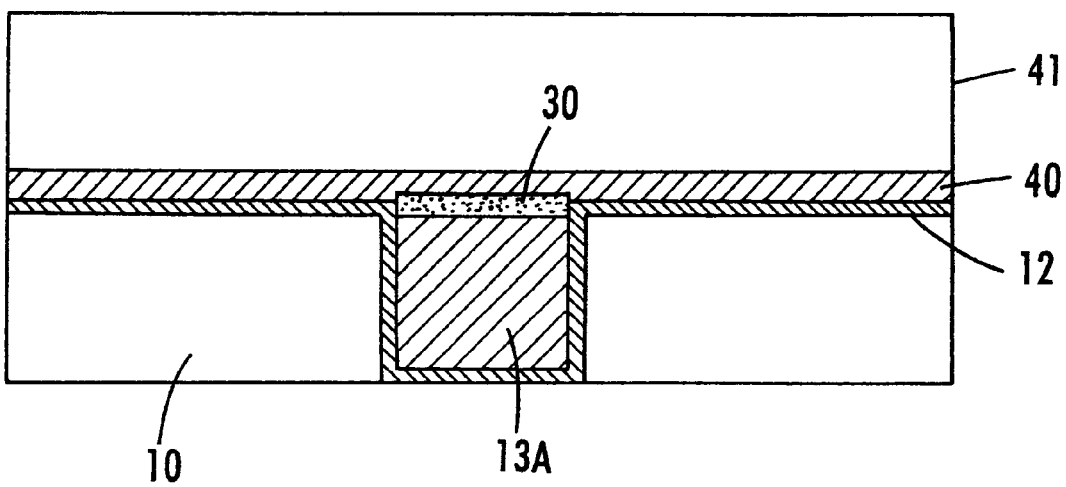

As shown in FIG. 4, SiH$_4$ is subsequently introduced into the deposition chamber and a silicon nitride capping layer 40 is deposited on the cleaned exposed surface 30 of Cu interconnect 13A. Another interlayer dielectric 41 is then deposited, such as a low-k material. In this way, a plurality of interlayer dielectrics and metallization patterns are built up on a semiconductor substrate and various interconnects are formed. Advantageously, the interface between the Cu interconnect and silicon nitride capping layer is substantially uniform, thereby improving the accuracy and reliability of interconnects for subsequent metallization levels, reducing electromigration failures and improving wafer-to-wafer uniformity.

Testing of capped Cu interconnects formed in accordance with embodiments of the present invention confirmed a significant improvement in electromigration performance, as by lognormal sigma measurements. Lognormal sigma is a measure of spread in electromigration (EM) data (failure times). Higher sigma leads to a lower projected EM lifetime at use conditions. The product EM lifetime is calculated by the following equation: Lifetime=T50% exp(–N*sigma) where T50% is Median time to fail (MTTF) and N=6 for T0.1% failure rate and product factor of about $10^6$.

Therefore, higher values of sigma could cause a significant degradation of projected lifetime due to the exponential dependence. The inventive soft plasma treatment disclosed here not only improves T50%, but also gives a tight sigma, which leads to a higher projected EM lifetime.

The present invention significantly improves the reliability of Cu interconnect members by enhancing adhesion of the capping layer with an attendant reduction in copper diffusion, significantly improves electromigration resistance and in significantly improves wafer-to-wafer uniformity. Consequently, the present invention advantageously reduces capping layer peeling, reduces copper diffusion, enhances electromigration resistance, improves device reliability, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
    treating a surface of copper (Cu) or Cu alloy layer with a plasma containing nitrogen (N$_2$) and ammonia (NH$_3$) in a chamber to reduce copper oxide on the surface at:
        an NH$_3$ flow rate of about 210 to about 310 sccm; and
        a N$_2$ flow rate of about 8,000 to about 9,200 sccm; and
    forming a capping layer on the treated surface of the Cu or Cu alloy layer.

2. The method according to claim 1, introducing silane into the chamber after treating the surface of the Cu or Cu alloy layer with the plasma to form a silicon nitride capping layer.

3. The method according to claim 2, comprising treating the surface of the Cu or Cu alloy layer with the plasma at:
    an RF power of about 50 to about 200 watts;
    a temperature of about 300° C. to about 400° C.; and
    a pressure of about 3 Torr. to about 5.0 Torr.

4. The method according to claim 3, comprising treating the surface of the Cu or Cu alloy layer with the plasma for about 5 to about 25 seconds before introducing silane.

5. The method according to claim 2, comprising introducing a wafer containing the Cu or Cu alloy layer into the chamber, wherein the Cu or Cu alloy layer fills an opening in a dielectric layer.

6. The method according to claim 5, comprising:
    introducing N$_2$ into the chamber;
    introducing NH$_3$ into the chamber;
    elevating the pressure; and initiating a plasma after about 10 to about 15 seconds.

7. The method according to claim 2, wherein the Cu or Cu alloy layer constitutes a dual damascene structure comprising a Cu or Cu alloy line in contact with an underlying Cu or Cu alloy via formed in a dielectric layer.

8. The method according to claim 7, wherein the dielectric layer comprises a dielectric material having a dielectric constant (k) less than about 3.9.

9. A method of manufacturing a semiconductor device, the method comprising:

introducing a wafer containing inlaid copper (Cu) or a Cu alloy into a chamber;

treating an exposed surface of the Cu or Cu alloy with a plasma containing ammonia ($NH_3$) and nitrogen ($N_2$) at:

an $NH_3$ flow rate of about 210 to about 310 sccm;
a $N_2$ flow rate of about 8,000 to about 9,200 sccm;
an RF power of about 50 to about 200 watts;
a temperature of about 300° C. to about 400° C.; and
a pressure of about 3 to about 5 Torr;

introducing silane ($SiH_4$) into the chamber after treating the surface of the Cu or Cu alloy with the plasma; and depositing a silicon nitride capping layer on the plasma treated Cu or Cu alloy surface.

10. The method according to claim 9, wherein the inlaid Cu or Cu alloy constitutes a dual damascene structure comprising a Cu or Cu alloy line in contact with an underlying Cu or Cu alloy via formed in a dielectric layer and in electrical contact with an underlying metal feature.

11. The method according to claim 10, wherein the dielectric layer comprises a dielectric material having a dielectric constant (k) less than about 3.9.

* * * * *